(12) United States Patent
Seo et al.

(10) Patent No.: US 9,454,074 B2
(45) Date of Patent: Sep. 27, 2016

(54) REFLECTIVE PHOTOMASK BLANKS AND REFLECTIVE PHOTOMASKS

(71) Applicant: Samsung Electronics Co., Ltd., Suwon-si (KR)

(72) Inventors: Hwan-seok Seo, Suwon-si (KR); Su-young Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 223 days.

(21) Appl. No.: 14/307,564

(22) Filed: Jun. 18, 2014

(65) Prior Publication Data
US 2015/0010854 A1 Jan. 8, 2015

(30) Foreign Application Priority Data
Jul. 2, 2013 (KR) ........................ 10-2013-0077297

(51) Int. Cl.
| | | |
|---|---|---|
| G03F 1/24 | (2012.01) | |
| G03F 1/50 | (2012.01) | |
| G03F 1/48 | (2012.01) | |

(52) U.S. Cl.
CPC .. *G03F 1/48* (2013.01); *G03F 1/24* (2013.01)

(58) Field of Classification Search
CPC .............. G03F 1/50; G03F 1/52; G03F 1/24
USPC .......................................................... 430/5
See application file for complete search history.

(56) References Cited

U.S. PATENT DOCUMENTS

| | | | |
|---|---|---|---|
| 6,998,200 B2 | 2/2006 | Lee | |
| 7,875,863 B2 | 1/2011 | Van Herpen et al. | |
| 7,927,767 B2 | 4/2011 | Ahn et al. | |
| 8,137,872 B2 | 3/2012 | Hayashi | |
| 8,241,821 B2 | 8/2012 | Ikuta | |
| 8,388,062 B2 | 3/2013 | Hennig et al. | |
| 2012/0069311 A1* | 3/2012 | Schwarzl | B82Y 10/00 355/53 |
| 2012/0129083 A1 | 5/2012 | Yoshimori et al. | |
| 2012/0322000 A1 | 12/2012 | Uno et al. | |
| 2013/0260292 A1* | 10/2013 | Yamazaki | G03F 7/70033 430/5 |
| 2013/0280643 A1* | 10/2013 | Hsu | G03F 1/24 430/5 |

FOREIGN PATENT DOCUMENTS

| | | |
|---|---|---|
| JP | 2005-286203 | 10/2005 |
| KR | 1020090032876 A | 4/2009 |
| KR | 1020100035559 A | 4/2010 |
| KR | 1020120081665 A | 7/2012 |

* cited by examiner

*Primary Examiner* — Stephen Rosasco
(74) *Attorney, Agent, or Firm* — Myers Bigel & Sibley, P.A.

(57) ABSTRACT

Reflective photomask blanks are provided. The reflective photomask blank includes a multi-layered reflection layer on a photomask substrate, a capping layer directly disposed on a top surface of the multi-layered reflection layer to include transition metal and silicon, a passivation layer disposed on a surface of the capping layer opposite to the multi-layered reflection layer, and a light absorption layer on the passivation layer.

20 Claims, 11 Drawing Sheets

REFLECTIVE PHOTOMASK BLANKS AND REFLECTIVE PHOTOMASKS

CROSS-REFERENCE TO RELATED APPLICATIONS

This application claims the benefit of Korean Patent Application No. 10-2013-0077297, filed on Jul. 2, 2013, in the Korean Intellectual Property Office, the disclosure of which is incorporated herein in its entirety by reference.

BACKGROUND

The inventive concept relates to photomasks used in fabrication of semiconductor devices, and more particularly, to reflective photomask blanks used in extreme ultraviolet (EUV) photolithography processes and reflective photomasks obtained from the reflective photomask blanks.

The wavelength of light used in a photolithography process (i.e., an exposure process) has been continuously reduced due to the decrease in design rules of semiconductor devices. Thus, an extreme ultraviolet (EUV) ray having a relatively short wavelength with respect to a beam having a wavelength of g-line or i-line has been used in the exposure process of a EUV lithography process. The EUV lithography process may be performed using a reflective exposure system including reflective EUV photomasks to transfer patterns of each reflective EUV photomask onto a wafer.

The EUV ray used in the EUV lithography process may be more readily absorbed into most material layers. Thus, it may be difficult for the reflective EUV photomasks to employ a pellicle which is widely used to protect the patterns of general photomask used in exposure processes that utilize an argon fluoride (ArF) laser or a krypton fluoride (KrF) laser as a light source. Accordingly, reflective EUV photomasks may be more readily contaminated by particles in the air and by carbon atoms which are a process byproduct due to a relatively high energy of the EUV ray. That is, the reflective EUV photomasks have to be periodically cleaned. As a result, improved photomasks may be still required to have increased life times and be free of physical damage and reflectivity degradation even though the exposure process and the cleaning process are repeatedly applied thereto.

SUMMARY

The inventive concept provides reflective photomask blanks and reflective photomasks fabricated using the same.

According to an aspect of the inventive concept, a reflective photomask blank includes a multi-layered reflection layer on a photomask substrate, a capping layer directly disposed on a top surface of the multi-layered reflection layer to include transition metal and silicon, a passivation layer disposed on a surface of the capping layer opposite to the multi-layered reflection layer and configured to prevent oxygen atoms from being introduced into an interface between the multi-layered reflection layer and the capping layer, and a light absorption layer on the passivation layer.

In some embodiments, the transition metal of the capping layer may include at least one selected from ruthenium (Ru), nickel (Ni) and iridium (Ir).

In some embodiments, the passivation layer may include a silicon oxide layer.

In some embodiments, a transition metal content of the capping layer may be greater than a silicon content thereof.

In some embodiments, the capping layer may further include at least one additive element selected from niobium (Nb), carbon (C), boron (B), aluminum (Al), yttrium (Y), germanium (Ge) and vanadium (V).

In some embodiments, the capping layer may further include a nitrogen element.

In some embodiments, the capping layer may include a compound material containing ruthenium (Ru) and silicon (Si).

In some embodiments, the capping layer may have a multi-layered structure obtained by alternately stacking a ruthenium (Ru) film and a silicon (Si) film at least once. In such a case, a thickness of the ruthenium (Ru) film may be greater than that of the silicon (Si) film.

In some embodiments, a thickness of the passivation layer may be less than that of the capping layer.

In some embodiments, the reflective photomask blank may further include a fiducial mark defined by a groove penetrating the capping layer. In such a case, the passivation layer may extend from a top surface of the capping layer to cover an inner surface of the groove defining the fiducial mark.

In some embodiments, the capping layer may include an amorphous layer.

In some embodiments, a topmost layer of the multi-layered reflection layer may be a silicon layer, and a thickness of the capping layer may be greater than that of the topmost layer of the multi-layered reflection layer.

According to another aspect of the inventive concept, a reflective photomask may be obtained by patterning a light absorption layer of a reflective photomask blank comprising a multi-layered reflection layer on a photomask substrate, a capping layer directly disposed on a top surface of the multi-layered reflection layer to include transition metal and silicon, a passivation layer disposed on a surface of the capping layer opposite to the multi-layered reflection layer, and the light absorption layer on a surface of the passivation layer opposite to the capping layer.

Some embodiments include a reflective photomask blank that includes a reflection layer on a photomask substrate, a capping layer on a top surface of the reflection layer and contacting the top surface of the reflection layer, the capping layer comprising a transition metal and silicon, and a passivation layer on a surface of the capping layer that is opposite the reflection layer and that contacts the capping layer. Some embodiments provide that the passivation layer is configured to prevent oxygen atoms from being introduced into an interface between the reflection layer and the capping layer.

In some embodiments, the capping layer includes a transition metal content and a silicon content that is less than the transition metal content. Some embodiments provide that the transition metal includes at least one of ruthenium (Ru), nickel (Ni) and iridium (Ir), the passivation layer includes silicon oxide, and the capping layer includes at least one of niobium (Nb), carbon (C), boron (B), aluminum (Al), yttrium (Y), germanium (Ge) and vanadium (V).

Some embodiments include a light absorption layer on the passivation layer.

In some embodiments, the capping layer includes nitrogen and a multi-layered structure obtained by alternately stacking a ruthenium (Ru) film and a silicon (Si) film at least once. A thickness of the ruthenium (Ru) film may be greater than a thickness of the silicon (Si) film.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EMBODIMENTS

Figure 1:
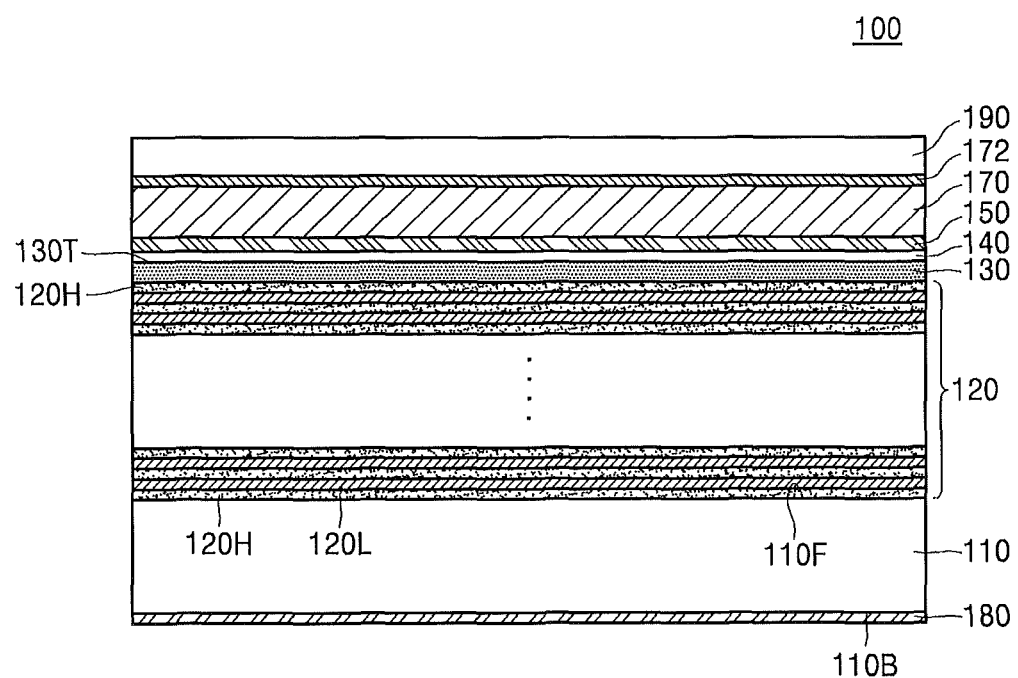
FIG. 1 is a cross-sectional view illustrating a reflective photomask blank according to some embodiments of the inventive concept.

Example embodiments of the inventive concept will now be described more fully hereinafter with reference to the accompanying drawings. Like reference numerals in the drawings denote like elements, and thus their description will be omitted to avoid duplicate explanation.

The following embodiments may be embodied in many different forms and should not be construed as being limited to the embodiments set forth herein. Rather, these embodiments are provided so that this disclosure will be thorough and complete, and will fully convey the concept of example embodiments to those of ordinary skill in the art.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Moreover, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto.

Additionally, in the accompanying drawings, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes.

As used herein, the term "and/or" includes any and all combinations of one or more of the associated listed items. Expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

FIG. 1 is a cross-sectional view illustrating a reflective photomask blank 100 according to some embodiments of the inventive concept.

Referring to FIG. 1, the reflective photomask blank 100 may include a multi-layered reflection layer 120 formed on a photomask substrate 110, a capping layer 130 directly formed on a top surface of the multi-layered reflection layer 120 to include transition metal and silicon, a passivation layer 140 formed on a surface of the capping layer 130 opposite to the multi-layered reflection layer 120 to prevent oxygen atoms from infiltrating into an interface between the multi-layered reflection layer 120 and the capping layer 130, a buffer layer 150 formed on the passivation layer 140, and a light absorption layer 170 formed on the buffer layer 150.

The photomask substrate 110 may include a dielectric material, a glass material, a semiconductor material, or a metal material. In some embodiments, the photomask substrate 110 may include a material having a relatively low thermal expansion coefficient. For example, the photomask substrate 110 may include a material having a thermal expansion coefficient of about $0\pm0.05\times10^{-7}/°$ C. at 20° C. Further, the photomask substrate 110 may be composed of a flat material that is resistant to cleaning solutions. For example, the photomask substrate 110 may be composed of a synthetic quartz glass material, a quartz glass material, an aluminosilicate glass material, a soda-lime glass material, a low thermal expansion material (LTEM) such as a silicon oxide ($SiO_2$)-titanium oxide ($TiO_2$) system glass material, a crystallized glass material obtained by precipitating a beta-quartz solid solution, a single crystalline silicon material, and/or a silicon carbide (SiC) material.

In some embodiments, a front side surface 110F of the photomask substrate 110 may have a flatness of about 50 nanometers or less, and a backside surface 110B of the photomask substrate 110 may have a flatness of about 500 nanometers or less. In addition, each of the front side surface 110F and the backside surface 110B of the photomask substrate 110 may have a surface roughness of about 0.15 nanometers or less in a root mean square (RMS) value.

The multi-layered reflection layer 120, the capping layer 130, the passivation layer 140, the buffer layer 150, and the light absorption layer 170 may be sequentially formed on the front side surface 110F of the photomask substrate 110, and a low reflectivity material layer 172 may be formed on a surface of the light absorption layer 170 opposite to the buffer layer 150. In some embodiments, a process of forming at least one of the buffer layer 150 and the low reflectivity material layer 172 may be omitted. A backside conductive layer 180 may be formed on the backside surface 110B of the photomask substrate 110.

The multi-layered reflection layer 120 may be formed to have a multi-layered mirror structure obtained by alternately and repeatedly stacking high refraction layers 120H and low refraction layers 120L. For example, the multi-layered reflection layer 120 may be formed by alternately stacking the high refraction layers 120H and the low refraction layers 120L about twenty times to about sixty times. A topmost layer of the multi-layered reflection layer 120 may be one of the high refraction layers 120H.

In some embodiments, the multi-layered reflection layer 120 may be formed of a plurality of pairs of a molybdenum (Mo) layer and a silicon (Si) layer, a plurality of pairs of a molybdenum (Mo) compound layer and a silicon (Si) compound layer, a plurality of pairs of a ruthenium (Ru) layer and a silicon (Si) layer, a plurality of pairs of a beryllium (Be) layer and a molybdenum (Mo) layer, an alternately stacked lamination layer of a silicon (Si) layer and a niobium (Nb) layer, a plurality of stack structures of a silicon (Si) layer, a molybdenum (Mo) layer and a ruthenium (Ru) layer, a plurality of stack structures of a silicon (Si) layer, a molybdenum (Mo) layer, a ruthenium (Ru) layer and a molybdenum (Mo) layer, and/or a plurality of stack structures of a silicon (Si) layer, a ruthenium (Ru) layer, a molybdenum (Mo) layer and/or a ruthenium (Ru) layer.

A material and a thickness of each layer constituting the multi-layered reflection layer 120 may be appropriately selected and determined according to a wavelength of an extreme ultraviolet (EUV) ray used in a EUV lithography process and/or a desired reflectivity of the multi-layered reflection layer 120. For example, when the multi-layered reflection layer 120 is formed of a plurality of pairs of a molybdenum (Mo) layer and a silicon (Si) layer, the molybdenum (Mo) layer corresponding to the low refraction layers 120L and the silicon (Si) layer corresponding to the high refraction layers 120H may each be formed to have a thickness of about 2 nanometers to about 5 nanometers.

The multi-layered reflection layer 120 may be formed using a direct current (DC) sputtering process, a radio frequency (RF) sputtering process and/or an ion beam sputtering process. For example, when the multi-layered reflection layer 120 is formed of a plurality of pairs of a molybdenum (Mo) layer and a silicon (Si) layer using an ion beam sputtering process, the silicon (Si) layer may be deposited using an argon (Ar) gas as a sputtering gas with a silicon target and the molybdenum (Mo) layer may be deposited using an argon (Ar) gas as a sputtering gas with a molybdenum (Mo) target. The multi-layered reflection layer 120 may be formed of about 40 to about 50 pairs of the silicon (Si) layer and the molybdenum (Mo) layer.

The capping layer 130 may protect the multi-layered reflection layer 120 such that the multi-layered reflection layer 120 is not damaged when an etching process or a defect repair process for patterning the reflective photomask blank 100 is performed to fabricate a reflective photomask. Further, the capping layer 130 may act as an oxidation resistant layer to prevent a surface of the multi-layered reflection layer 120 from being oxidized.

The capping layer 130 may be formed using an in-situ process that is performed without vacuum break after forming the multi-layered reflection layer 120. That is, the capping layer 130 may be formed using a process chamber inside of which the multi-layered reflection layer 120 is formed. Accordingly, no oxide layer may be formed between the multi-layered reflection layer 120 and the capping layer 130 because the multi-layered reflection layer 120 is not exposed to the air until the capping layer 130 is formed, and no intermixing film may be formed between the multi-layered reflection layer 120 and the capping layer 130.

The capping layer 130 may include at least one transition metal selected from ruthenium (Ru), nickel (Ni) and iridium (Ir). In the capping layer 130, the transition metal content may be greater than the silicon content.

The capping layer 130 may be formed to have a thickness of about one nanometer to about 6 nanometers. In some embodiments, the capping layer 130 may be formed to have a thickness which is greater than that of the topmost layer (i.e., the high refraction layers 120H) of the multi-layered reflection layer 120. For example, the high refraction layers 120H corresponding to the topmost layer of the multi-layered reflection layer 120 may each be formed to have a thickness of about 1.5 nanometers to about 2.5 nanometers, and the capping layer 130 may be formed to have a thickness of about 3 nanometers to about 6 nanometers.

In some embodiments, the capping layer 130 may be formed of a binary element system compound material including ruthenium (Ru) and silicon (Si). For example, the capping layer 130 may be formed of an Ru—Si binary element system compound material such as an $Ru_4Si_3$, RuSi or $Ru_2Si_3$. The Ru—Si binary element system compound material constituting the capping layer 130 may not include an Ru-based hexagonal close-packed (hcp) phase and a silicon phase of an A4 diamond cubic grain structure. In such a case, the silicon content of the Ru—Si binary element system compound material constituting the capping layer 130 may be within the range from about 42.8 atomic % to 60 atomic %.

In some embodiments, a reflectivity of the multi-layered reflection layer 120 may be optimized by optimizing a thickness of the capping layer 130 formed of an Ru—Si binary element system compound material. For example, if the topmost layer (i.e., the high refraction layers 120H) of the multi-layered reflection layer 120 is formed of a silicon layer having a thickness of about 2 nanometers, the capping layer 130 may be formed of an Ru—Si binary element system compound material having a thickness of about 4.5 nanometers to optimize the reflectivity of the multi-layered reflection layer 120.

In some embodiments, the silicon content of the Ru—Si binary element system compound material constituting the capping layer 130 may be less than the ruthenium content thereof. This is for preventing damage from occurring to the capping layer 130 due to a chlorine-based gas used as an etch gas when the light absorption layer 170 is etched to form a reflective photomask.

When the capping layer 130 is formed of an Ru—Si binary element system compound material using an ion beam sputtering process, the ion beam sputtering process may be performed using a target composed of a mixture of ruthenium and silicon. In such a case, the ruthenium content of the target may be greater than the silicon content of the target. This is for forming the capping layer 130 having the ruthenium content which is greater than the silicon content. For example, the capping layer 130 may be formed to have a silicon content which is equal to or greater than 5 atomic % and which is less than 50 atomic %.

In some embodiments, the capping layer 130 may be formed of an Ru—Si—N compound material. For example, when a sputtering process for forming the capping layer 130 is performed using an Ru—Si target, a mixture gas of argon (Ar) and nitrogen (N) may be used as an ambient gas such that nitrogen atoms in the ambient gas are introduced into the capping layer 130 to obtain an Ru—Si—N compound material corresponding to the capping layer 130.

In some embodiments, the capping layer 130 may be formed of an amorphous layer. For example, the capping layer 130 may be formed of an Ru—Si compound material including at least one additive element of niobium (Nb), carbon (C), boron (B), aluminum (Al), yttrium (Y), germanium (Ge) and vanadium (V). If the at least one additive element is introduced into the capping layer 130, an amorphous property of the capping layer 130 may be enhanced or reinforced. If the at least one additive element is introduced into the capping layer 130, a mechanical characteristic of the capping layer 130 is reinforced to improve an etch selectivity of the capping layer 130 with respect to other material layers even though the capping layer 130 is exposed to an etching process for etching the other material layers, for example, the light absorption layer 170 during formation of a reflective photomask.

The capping layer 130 including the at least one additive element may be formed using an ion beam sputtering process that employs a compound target including ruthenium (Ru), silicon (Si) and the at least one additive element as a target. In the compound target, the ruthenium content may be greater than the silicon content and the silicon content may be greater than the additive element content.

In some embodiments, the capping layer 130 may be formed to have a multi-layered structure obtained by alternately stacking a transition metal film and a silicon film at least once. For example, the capping layer 130 may be formed by alternately and repeatedly stacking a ruthenium film and a silicon film. That is, the capping layer 130 may be formed to have a double layered structure obtained by sequentially stacking a ruthenium film and a silicon film. In such a case, the ruthenium film may be thicker than the silicon film. For example, the ruthenium film may be formed to have a thickness of about 3 nanometers to about 5 nanometers, and the silicon film may be formed to have a thickness of about 1 nanometer to about 3 nanometers. When the capping layer 130 is formed to include a transition metal film and a silicon film stacked on the transition metal film, the passivation layer 140 may be formed on a surface of the silicon film opposite to the transition metal film and a portion of the silicon film may be oxidized during formation of the passivation layer 140 to constitute the passivation layer 140. In such a case, because a surface of the capping layer 130 is oxidized during formation of the passivation layer 140, an interface between the multi-layered reflection layer 120 and the capping layer 130 may be prevented from being oxidized. Thus, a peeling phenomenon of the capping layer 130 or damage applied to the multi-layered reflection layer 120 may be suppressed. In other embodiments, the capping layer 130 may be formed to have a multi-layered structure obtained by alternately stacking a ruthenium film and a silicon film twice or more. In such a case, the capping layer 130 including the ruthenium films and the silicon films alternately stacked may be formed by alternately performing a first ion beam sputtering process for forming the ruthenium film using a ruthenium target and a second ion beam sputtering process for forming the silicon film using a silicon target in the same chamber. The ruthenium film may be formed to have a thickness of about 0.5 angstroms to about a few angstroms, and the silicon film may also be formed to have a thickness of about 0.5 angstroms to about a few angstroms. The ruthenium film may be formed to be thicker than the silicon film such that the ruthenium content of the capping layer 130 is greater than the silicon content thereof.

The passivation layer 140 may be formed of a silicon oxide layer.

In some embodiments, the passivation layer 140 may be formed by thermally oxidizing the capping layer 130 to form an oxide layer having a predetermined thickness after exposing a top surface 130T of the capping layer 130 to the air. The thermal oxidation process for forming the passivation layer 140 may be performed at a temperature of about 100 degrees Celsius to about 200 degrees Celsius for about 1 minute to about 10 minutes.

In some embodiments, the passivation layer 140 may be formed by loading a substrate including the capping layer 130 into a vacuum chamber and by oxidizing the top surface 130T of the capping layer 130 using an oxygen gas as an ambient gas at a predetermined temperature for a predetermined time. For example, the passivation layer 140 may be formed by thermally oxidizing the top surface 130T of the capping layer 130 using an oxygen gas as an ambient gas at a temperature of about 100 degrees Celsius to about 200 degrees Celsius for about 1 minute to about 10 minutes in a vacuum chamber.

In some embodiments, the capping layer 130 and the passivation layer 140 may be successively formed using an in-situ process that is performed in the same chamber without vacuum break.

In some embodiments, the passivation layer 140 may be formed to be thinner than the capping layer 130. For example, the passivation layer 140 may be formed to have a thickness of about 1 nanometer or less.

The passivation layer 140 may be formed to cover the capping layer 130. Thus, while the reflective photomask blank 100 is formed or etching processes for patterning the reflective photomask blank 100 are performed to form a reflective photomask, the passivation layer 140 may prevent oxygen atoms from being introduced into the capping layer 130 and/or into an interface between the multi-layered reflection layer 120 and the capping layer 130. As a result, a bulk region of the capping layer 130 and/or an interface between the multi-layered reflection layer 120 and the capping layer 130 may not be oxidized because of the presence of the passivation layer 140. Accordingly, a separation phenomenon of the multi-layered reflection layer 120 and the capping layer 130 and a peeling phenomenon of the capping layer 130 may be suppressed to prevent the capping layer 130 and the multi-layered reflection layer 120 from being degraded and damaged. To this end, the endurance of the reflective photomask blank 100 may be enhanced to prevent a reflectivity of the multi-layered reflection layer 120 from being degraded even though cleaning processes, for example, accelerated cleaning processes utilizing an ultraviolet (UV) ray, are applied to the reflective photomask blank 100 or a reflective photomask obtained therefrom. This is because the capping layer 130 covering the multi-layered reflection layer 120 is protected by the passivation layer 140. Thus, the lifetimes of the reflective photomask blank 100 and a reflective photomask obtained therefrom may be improved.

The buffer layer 150 may protect the capping layer 130 such that the capping layer 130 is not damaged when the light absorption layer 170 is etched using a dry etching process to form a reflective photomask. In addition, the buffer layer 150 may protect the capping layer 130 such that the multi-layered reflection layer 120 is not damaged when a repair process is performed to remove black spots (i.e., black defects) or white spots (i.e., white defects) formed in a pattern region during formation of the reflective photomask blank 100 or a reflective photomask.

The buffer layer 150 may be formed of a material having a low light absorptivity, in particular, a low EUV ray absorptivity. In some embodiments, the buffer layer 150 may be formed of a ruthenium (Ru) layer, a ruthenium boride (RuB) layer, a ruthenium silicide (RuSi) layer, a chrome (Cr) layer, a chrome nitride (CrN) layer, an aluminum (Al) layer, an aluminum nitride (AlN) layer, a tantalum (Ta) layer, a tantalum nitride (TaN) layer, a platinum (Pt) layer, an iridium (Ir) layer, a platinum (Pt) layer, a silicon oxide ($SiO_2$) layer, a silicon nitride ($Si_3N_4$) layer, an aluminum oxide ($A_{12}O_3$) layer and/or a combination thereof. In some embodiments, the buffer layer 150 may be formed of a material layer having an etch selectivity with respect to the capping layer 130.

The buffer layer 150 may be formed using a sputtering process. For example, when the buffer layer 150 is formed of a ruthenium (Ru) layer, the buffer layer 150 may be formed using a magnetron sputtering process that employs a ruthenium (Ru) target as a target material and an argon (Ar) gas as a sputtering gas. In some embodiments, the buffer layer 150 may be formed to have a thickness of about 1 nanometer to about 100 nanometers.

The light absorption layer 170 may be etched to fabricate a reflective photomask and a portion of the buffer layer 150 may be exposed after the etching of the light absorption layer 170. In the event that the buffer layer 150 is formed of a material layer having a relatively high EUV ray absorptivity, the exposed portion of the buffer layer 150 may also be etched right after the etching of the light absorption layer 170.

In FIG. 1, the passivation layer 140 and the light absorption layer 170 may be separated from each other by the buffer layer 150 disposed therebetween, but the inventive concept is not limited thereto. For example, the process for forming the buffer layer 150 may be omitted. In such a case, the light absorption layer 170 may be directly formed on the passivation layer 140 such that the light absorption layer 170 contacts the passivation layer 140.

The light absorption layer 170 may be formed of a material having a relatively high EUV ray absorptivity, that is, a relatively low EUV ray reflectivity. Further, the light absorption layer 170 may be formed of a material having an excellent chemical resistant property. In some embodiments, the light absorption layer 170 may be formed of a material exhibiting a maximum light reflectivity of about 5% or less with respect to a light having a wavelength of about 13.5 nanometers when EUV rays are irradiated onto a surface of the light absorption layer 170.

The light absorption layer 170 may be formed of a material whose major element is tantalum (Ta). In some embodiments, the light absorption layer 170 may be formed to include the major element (i.e., tantalum) and at least one element of hafnium (Hf), silicon (Si), zirconium (Zr), germanium (Ge), boron (B), nitrogen (N) and hydrogen (H). For example, the light absorption layer 170 may be formed of a TaN layer, a TaHf layer, TaHfN layer, a TaBSi layer, a TaBSiN layer, a TaB layer, a TaBN layer, a TaSi layer, a TaSiN layer, a TaGe layer, a TaGeN layer, a TaZr layer, a TaZrN layer and/or a combination thereof. In some embodiments, the light absorption layer 170 may be formed of a material having a tantalum content of at least 40 atomic %. In some embodiments, the light absorption layer 170 may be formed to have an oxygen content of about 25 atomic % or less in addition to a tantalum content of at least 40 atomic %.

In some embodiments, the light absorption layer 170 may be formed using a sputtering process, but the inventive concept is not limited thereto. In some embodiments, the light absorption layer 170 may be formed to have a thickness of about 30 nanometers to about 200 nanometers.

The low reflectivity material layer 172 may be formed of a material exhibiting a relatively low reflectivity in a wavelength range (e.g., a wavelength range from about 190 nanometers to about 260 nanometers) of inspection rays used in inspection of the reflective photomask blank 100 to obtain a sufficient contrast during the inspection of the reflective photomask blank 100. For example, the low reflectivity material layer 172 may be formed of a TaBO layer, a TaBNO layer, a TaOH layer, a TaON layer or a TaONH layer. The low reflectivity material layer 172 may be formed using a sputtering process, but the inventive concept is not limited thereto.

In some embodiments, the low reflectivity material layer 172 may be formed to have a thickness of about 5 nanometers to about 25 nanometers.

A mask layer 190 may be formed on a surface of the low reflectivity material layer 172 opposite to the light absorption layer 170. The mask layer 190 may be formed of a hard mask layer, an electron beam resist layer or a combination thereof. The mask layer 190 may be patterned using an electron beam lithography process and a development process to form an etch mask pattern for patterning the light absorption layer 170.

The backside conductive layer 180 formed on the backside surface 110B of the photomask substrate 110 may be advantageously utilized when the photomask substrate 110 is supported by an electrostatic chuck to prevent the photomask substrate 110 from being warped during an exposure process.

In some embodiments, the backside conductive layer 180 may be formed of a chrome (Cr) layer and/or a chrome nitride (CrN) layer. The backside conductive layer 180 may be formed to have a thickness of about 20 nanometers to about 80 nanometers.

Figure 2:
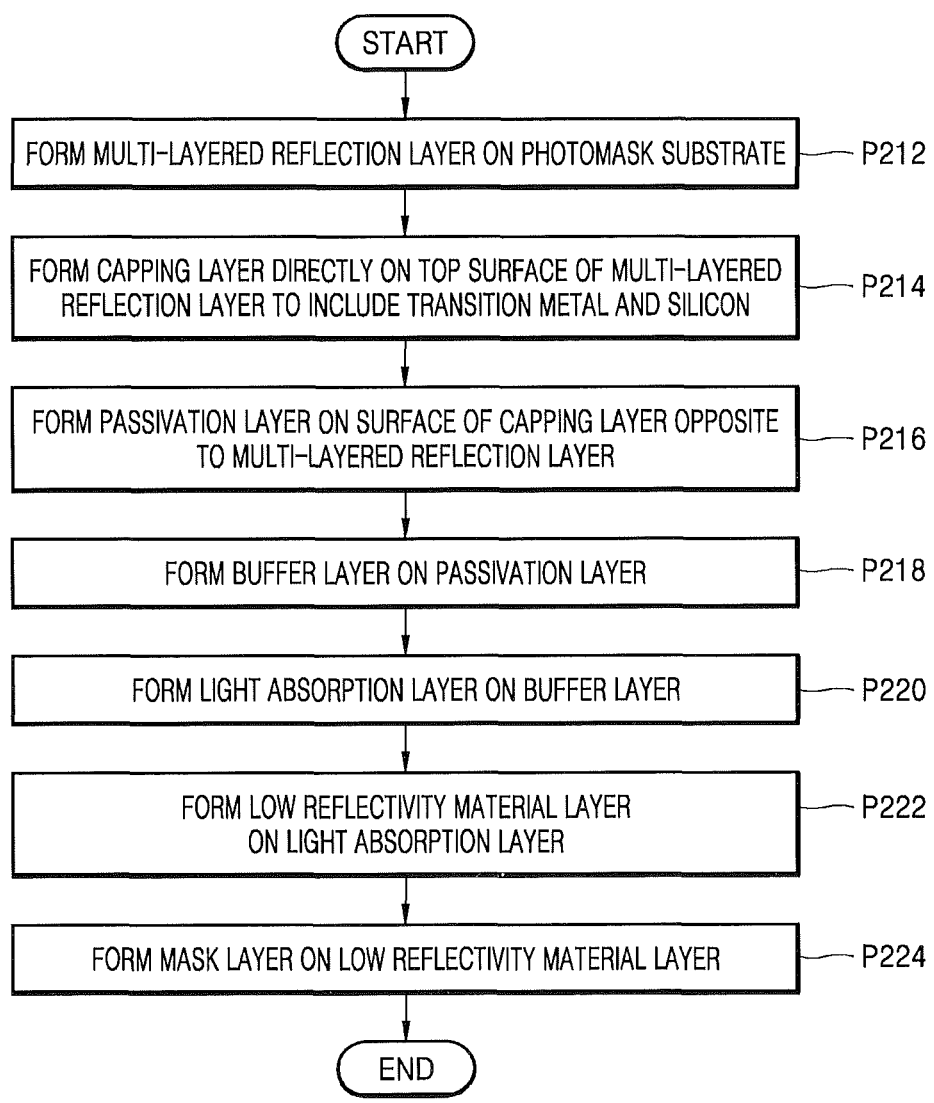
FIG. 2 is a flowchart illustrating a method of fabricating a reflective photomask blank according to some embodiments of the inventive concept.

FIG. 2 is a flowchart illustrating methods of fabricating a reflective photomask blank according to some embodiments of the inventive concept. The following embodiment will be described in conjunction with a method of fabricating the reflective photomask blank 100 illustrated in FIG. 1.

Referring to FIGS. 1 and 2, in a process operation P212, a multi-layered reflection layer 120 may be formed on a photomask substrate 110.

A backside surface 110B of the photomask substrate 110 may be covered with a backside conductive layer 180.

Figure 3A:
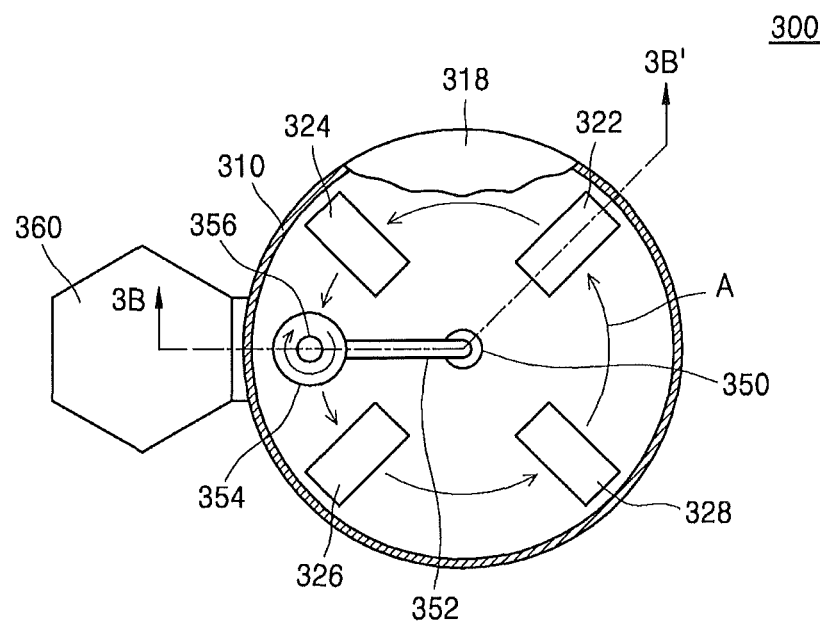
FIGS. 3A and 3B are a plan view and a cross-sectional view of a sputtering deposition apparatus used in fabrication of a reflective photomask blank according to some embodiments of the inventive concept, respectively.
Figure 3B:
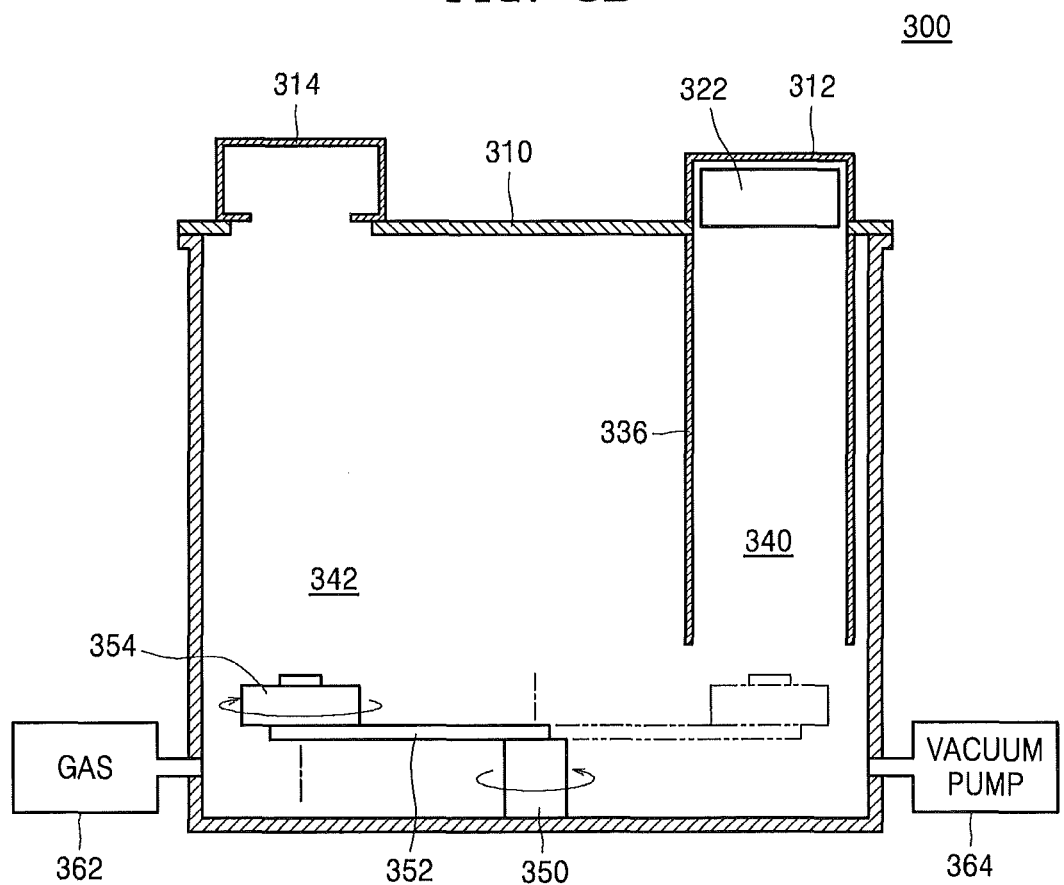

In some embodiments, the multi-layered reflection layer 120 may be formed using a physical vapor deposition apparatus, for example, a sputtering apparatus 300 illustrated in FIGS. 3A and 3B. FIG. 3B is a cross-sectional view taken along a line 3B-3B' of FIG. 3A.

The sputtering apparatus 300 may include a vacuum chamber 310 and a plurality of targets 322, 324, 326 and 328 disposed in the vacuum chamber 310. The plurality of targets 322, 324, 326 and 328 may be spaced apart from each other and may be faced to an inside portion of the vacuum chamber 310 through openings formed in a chamber cover 318. According to the present embodiment, the number of the targets 322, 324, 326 and 328 is four, as illustrated in FIG. 3A. However, the inventive concept is not limited thereto. For example, in some embodiments, the number of the targets may be three or less or may be five or more. The plurality of targets 322, 324, 326 and 328 may be disposed in respective ones of containers 312 located at upper parts of the vacuum chamber 310.

Path units 336 may be installed under respective ones of the targets 322, 324, 326 and 328 to provide paths through which particles sputtered from the targets 322, 324, 326 and 328 travel. Upper openings of the path units 336 may face respective ones of the targets 322, 324, 326 and 328, and lower openings of the path units 336 may provide deposition regions 340.

A rotary arm 352 and a substrate carrier 354 may be disposed in the vacuum chamber 310. One end of the rotary arm 352 may be connected to a first axis 350 and the substrate carrier 354 may be disposed on the other end of the rotary arm 352. Thus, if the first axis 350 rotates, the rotary arm 352 and the substrate carrier 354 may also rotate on the first axis 350. In addition, the substrate carrier 354 on which the photomask substrate 354 is placed may rotate on a second axis 356 connected to the other end of the rotary arm 352. While the multi-layered reflection layer 120 is formed on the photomask substrate 110, the photomask substrate 110 may be supported by the substrate carrier 354 such that the front surface 110F of the photomask substrate 110 faces the deposition regions 340.

The photomask substrate 110 may be loaded into the vacuum chamber 310 or may be unloaded from the vacuum chamber 310, through a load/unload portion 360.

The plurality of targets may include a first target 322 providing a source material for forming the high refraction layers 120H of the multi-layered reflection layer 120 and a second target 324 providing a source material for forming the low refraction layers 120L of the multi-layered reflection layer 120. In such a case, in order to form the multi-layered reflection layer 120 on the photomask substrate 110, the rotary arm 352 may be used to move the substrate carrier 354 supporting the photomask substrate 110 in a circle in a direction indicated by an arrow 'A' and repeatedly in a back and forth motion between a first position under the first target 322 and a second position under the second target 324.

A gas inlet 362 may be disposed to penetrate a wall of the vacuum chamber 310. Thus, a processing space 342 in the vacuum chamber 310 may be spatially connected to at least one gas tank (not shown) through the gas inlet 362. Process gases such as an oxygen gas, a nitrogen gas and/or an argon gas may be supplied to the vacuum chamber 310 through the gas inlet 362 to form a predetermined layer on the photomask substrate 110 loaded into the vacuum chamber 310.

The vacuum chamber 310 may include an ion source 314 located on the chamber cover 318. The ion source 314 may supply energetic particle beams into the processing space 342 in the vacuum chamber 310.

The vacuum chamber 310 may be evacuated by a vacuum pump 364 and may be filled with an inert gas such as an argon gas.

In a process operation P214 of FIG. 2, a capping layer 130 including a transition metal and silicon may be directly formed on a top surface of the multi-layered reflection layer 120.

The capping layer 130 may be formed using the sputtering apparatus 300 illustrated in FIGS. 3A and 3B. In some embodiments, after forming the multi-layered reflection layer 120 in the vacuum chamber 310 of the sputtering apparatus 300, the capping layer 130 may be directly formed on the multi-layered reflection layer 120 using an in-situ process that is performed in the vacuum chamber 310 without vacuum break.

In some embodiments, the capping layer 130 may be formed to include an Ru—Si compound material. In order to form the capping layer 130 including an Ru—Si compound material, the plurality of targets disposed in the sputtering apparatus 300 may include a third target 326 composed of an Ru—Si source material that has a predetermined composition. For example, the Ru—Si source material of the third target 326 may include a silicon material having a content of about 5 atomic % to about 45 atomic %. A rest content of the Ru—Si source material may correspond to a ruthenium content. In other embodiments, the capping layer 130 may be an alloy material that further includes at least one additive element of niobium (Nb), carbon (C), boron (B), aluminum (Al), yttrium (Y), germanium (Ge) and vanadium (V) in addition to ruthenium and silicon. When the at least one additive element is niobium (Nb), the third target 326 may be composed of an Ru—Si—Nb source material having a predetermined composition. The Ru—Si—Nb source material may include a silicon material having a content of about 5 atomic % to about 45 atomic % and a niobium material having a content of about 1 atomic % to about 5 atomic %. A rest content of the Ru—Si—Nb source material may correspond to a ruthenium content. In still other embodiments, the capping layer 130 may further include a nitrogen element in addition to ruthenium, silicon and niobium. In such a case, a nitrogen gas may be supplied into the vacuum chamber 310 through the gas inlet 362 during formation of the capping layer 130.

The substrate carrier 354 supporting the photomask substrate 110 including the multi-layered reflection layer 120 may be moved to a third position under the third target 326 to form the capping layer 130 on the multi-layered reflection layer 120.

In some embodiments, the capping layer 130 may be formed to have a multi-layered structure obtained by alternately stacking a ruthenium film and a silicon film at least once. In order to form the capping layer 130 having the multi-layered structure, the plurality of targets may include a third target 326 providing a ruthenium source material and a fourth target 328 providing a silicon source material. In such a case, in order to form the capping layer 130, the rotary arm 352 may be used to move the substrate carrier 354 supporting the photomask substrate 110 in a circle in a direction indicated by an arrow 'A' and repeatedly in a back and forth motion between a third position under the third target 326 and a fourth position under the fourth target 328.

In a process operation P216 of FIG. 2, a passivation layer 140 may be formed on a surface of the capping layer 130 opposite to the multi-layered reflection layer 120 to prevent oxygen atoms from being introduced into an interface between the multi-layered reflection layer 120 and the capping layer 130 through the capping layer 130.

In some embodiments, the passivation layer 140 may be formed by thermally oxidizing the capping layer 130 to form an oxide layer having a predetermined thickness after exposing the top surface 130T of the capping layer 130 to the air. The thermal oxidation process for forming the passivation layer 140 may be performed at a temperature of about 100 degrees Celsius to about 200 degrees Celsius for about 1 minute to about 10 minutes.

In other embodiments, the passivation layer 140 may be formed using the sputtering apparatus 300 illustrated in FIGS. 3A and 3B. For example, the passivation layer 140 may be formed on the capping layer 130 by oxidizing the top surface 130T of the capping layer 130 to form an oxide layer having a predetermined thickness at a predetermined temperature for a predetermined time in the vacuum chamber 310 filled with an oxygen gas. The passivation layer 140 may be directly formed on the capping layer 130 using an in-situ process that is performed in the vacuum chamber 310 without vacuum break after forming the capping layer 130 in the vacuum chamber 310.

Subsequently, in process operations P218, P220, P222 and P224, a buffer layer 150, a light absorption layer 170, a low reflectivity material layer 172 and a mask layer 190 may be sequentially formed on the passivation layer 140.

Figure 4A:
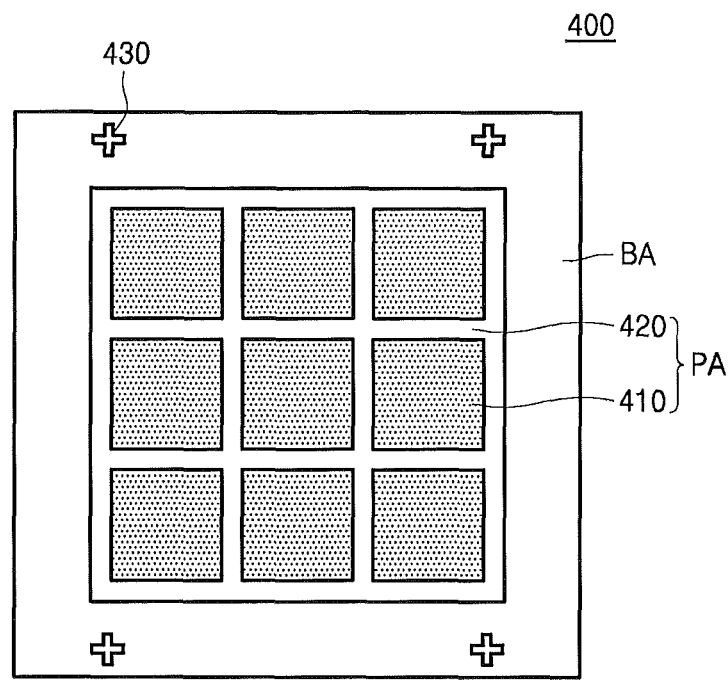
FIG. 4A is a plan view illustrating a schematic configuration of a reflective photomask blank according to some embodiments of the inventive concept.
Figure 4B:
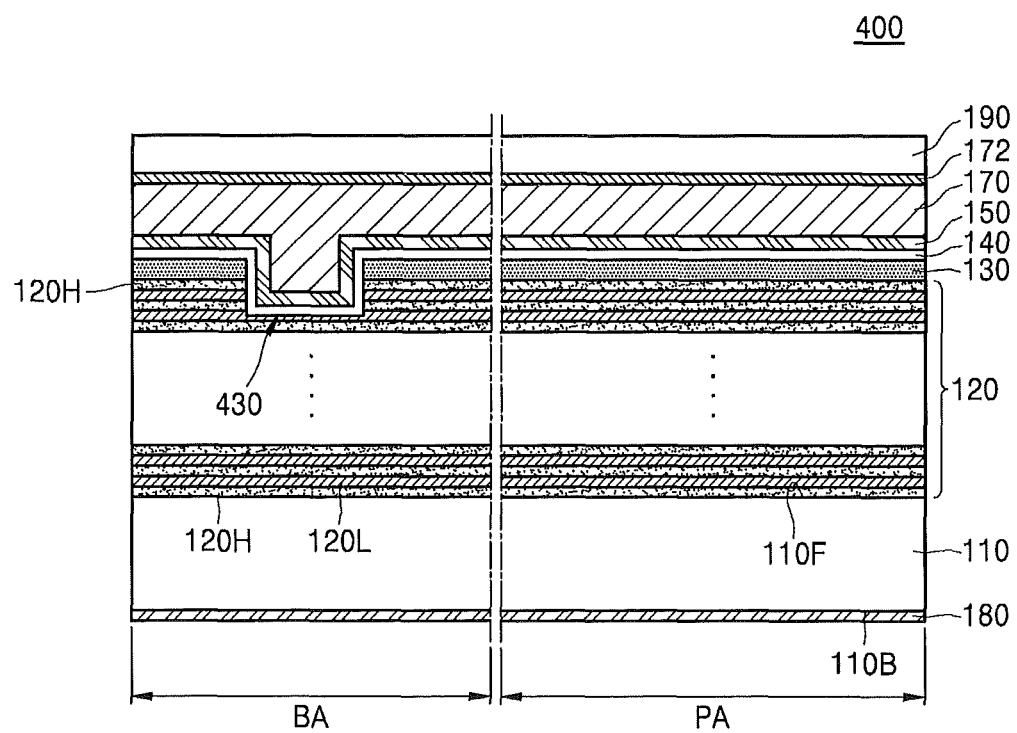
FIG. 4B is a merged cross-sectional view of a portion of a pattern region and a portion of a black border region constituting a reflective photomask blank according to some embodiments of the inventive concept.

FIG. 4A is a plan view illustrating a schematic configuration of a reflective photomask blank according to some embodiments of the inventive concept, and FIG. 4B is a merged cross-sectional view illustrating a portion of a pattern region PA and a portion of a black border region BA constituting the reflective photomask blank 400 shown in FIG. 4A. In FIGS. 4A and 4B, the same reference designators as used in FIG. 1 denote the same elements. Thus, detailed descriptions of the same elements as described with reference to FIG. 1 will be omitted to avoid duplicate explanation.

Referring to FIGS. 4A and 4B, the reflective photomask blank 400 may include a pattern region PA, and the pattern region PA may include a main pattern region 410 and an auxiliary pattern region 420. The main pattern region 410 may include a plurality of main patterns which are transferred onto chip regions of a wafer (not shown) to form unit devices constituting integrated circuits in the chip regions, and the auxiliary pattern region 420 may include a plurality of auxiliary patterns which are transferred onto a scribe lane between the chip regions. The pattern region PA may be surrounded by a black border region BA.

Whereas the reflective photomask blank 400 includes at least one fiducial mark 430 formed in the black border region BA, the reflective photomask blank 100 illustrated in FIG. 1 does not include any fiducial marks. That is, the reflective photomask blank 400 may have substantially the same configuration as the reflective photomask blank 100 of FIG. 1 except for the fiducial mark 430.

FIG. 4A illustrates the reflective photomask blank 400 including four fiducial marks 430, but the inventive concept is not limited thereto. For example, the number of the fiducial marks 430 may be greater than or less than four, according to the embodiments.

The at least one fiducial mark 430 may be used as a reference point (i.e., the origin of the coordinate system) for describing positions of defects that can be generated when the plurality of layers constituting the reflective photomask blank 400 are formed.

The at least one fiducial mark 430 may be defined by at least one groove penetrating the capping layer 130. In such a case, the passivation layer 140 may cover a top surface of the capping layer 130 and may extend to cover sidewalls and a bottom surface of the at least one groove.

As illustrated in FIG. 4B, the buffer layer 150 and the light absorption layer 170 may also extend into the groove defining the at least one fiducial mark 430, but the inventive concept is not limited thereto.

FIGS. 5A to 5E are cross-sectional views illustrating a method of fabricating a reflective photomask blank according to an embodiment of the inventive concept. The embodiment illustrated in FIGS. 5A to 5E will be described in conjunction with a method of fabricating the reflective photomask blank 400 shown in FIGS. 4A and 4B.

Figure 5A:
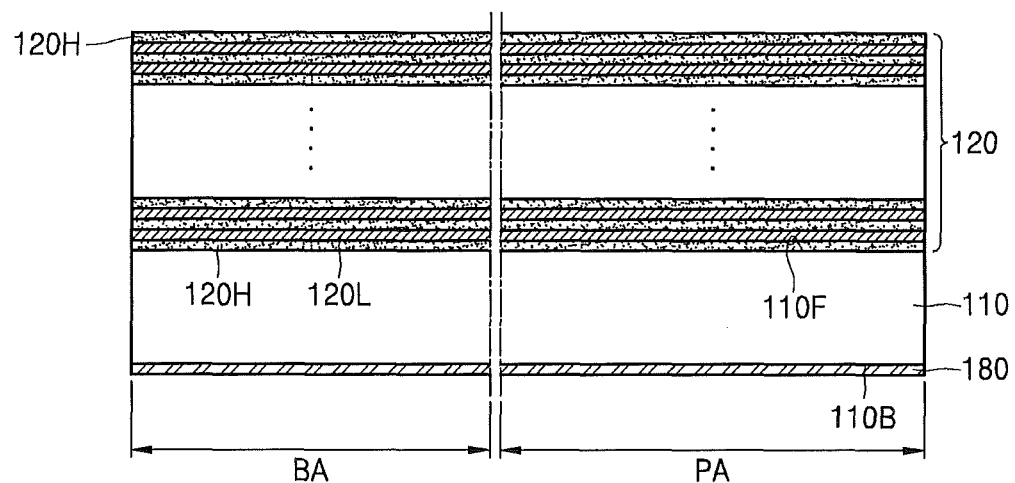
FIGS. 5A to 5E are cross-sectional views illustrating a method of fabricating a reflective photomask blank according to some embodiments of the inventive concept.

Referring to FIG. 5A, a multi-layered reflection layer 120 may be formed on a photomask substrate 110 including a black border region BA and a pattern region PA using the same method as described with reference to FIGS. 1, 2, 3A and 3B.

Figure 5B:
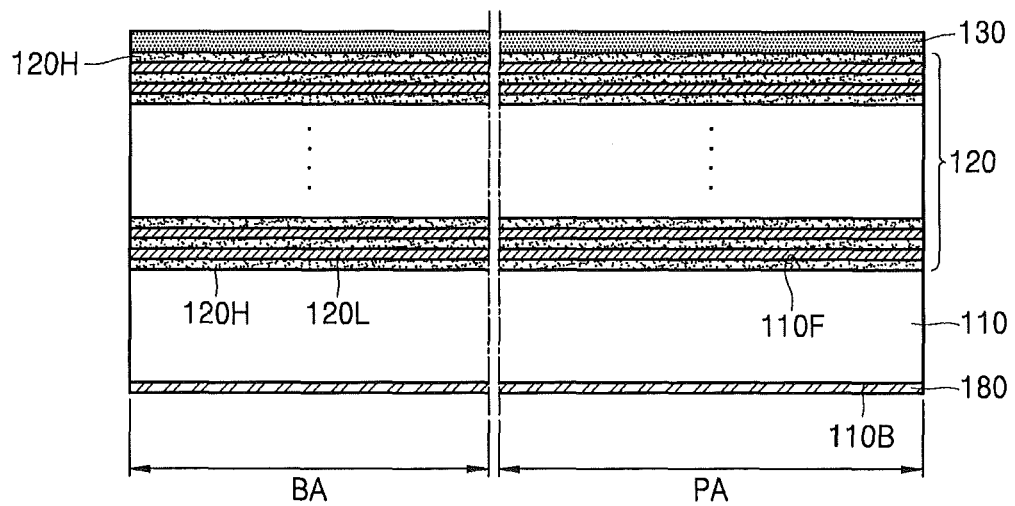

Referring to FIG. 5B, a capping layer 130 may be formed on the multi-layered reflection layer 120 in the black border region BA and the pattern region PA using the same method as described with reference to FIGS. 1, 2, 3A and 3B.

Figure 5C:
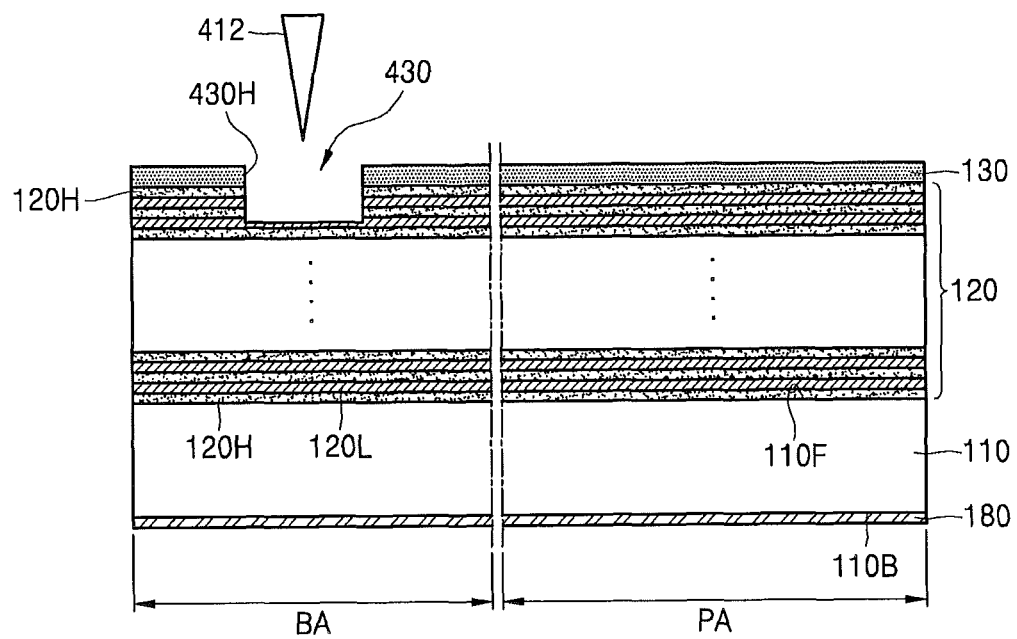

Referring to FIG. 5C, focused ion beams 412 may be irradiated on at least one selected position of the capping layer 130 in the black border region BA to remove a portion of the capping layer 130 and a portion of the multi-layered reflection layer 120 and to form at least one fiducial mark 430 in the capping layer 130 and the multi-layered reflection layer 120. The at least one fiducial mark 430 may be used as a reference point for describing positions of defects that can be generated in the multi-layered reflection layer 120.

The at least one fiducial mark 430 may be defined by at least one groove 430H penetrating the capping layer 130. The at least one groove 430H may expose the multi-layered reflection layer 120.

In some embodiments, a gas assist etching (GAE) process performed with an assistant gas may be accompanied with irradiation of the focused ion beams 412. The assistant gas used in the GAE process may be utilized to increase an etch rate of the capping layer 130 and to prevent by-products generated during formation of the groove 430H from being adsorbed onto a surface of the capping layer 130.

In some embodiments, after the at least one fiducial mark 430 is formed, an inspection process may be performed using the at least one fiducial mark 430 as a reference point to extract information on positions of defects existing on and/or in the multi-layered reflection layer 120. In other embodiments, the information on the positions of the defects may be extracted after a passivation layer (140 of FIG. 5D) is formed in a subsequent process.

Figure 5D:
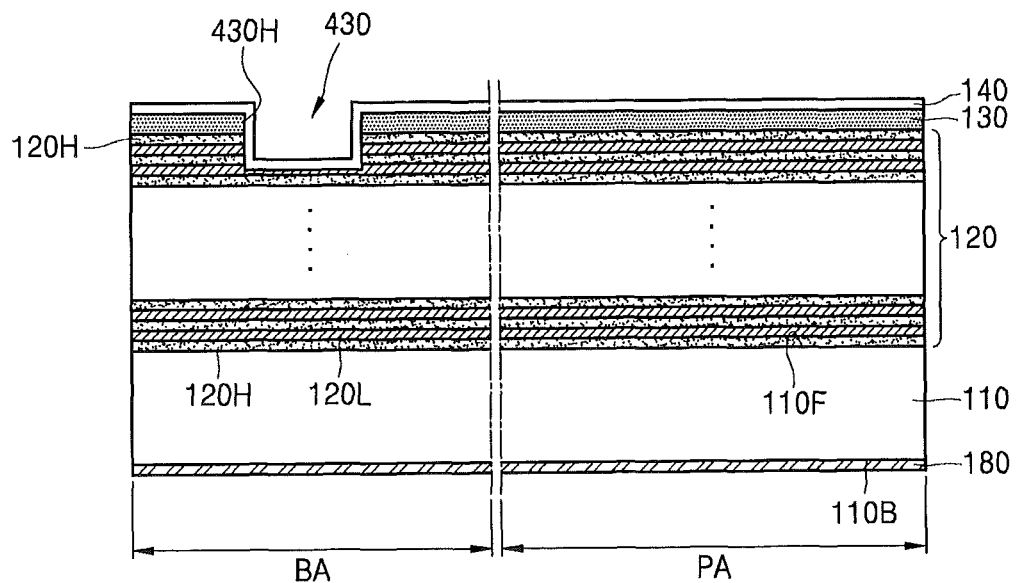

Referring to FIG. 5D, a passivation layer 140 may be formed on a top surface of the capping layer 130 and on the multi-layered reflection layer 120 exposed by the at least one fiducial mark 430.

In some embodiments, the passivation layer 140 may be formed by a thermal oxidation process that is secondarily (i.e., unintentionally) performed when the substrate including the at least one fiducial mark 430 is annealed.

In other embodiments, the focused ion beams 412 may be irradiated in an oxygen containing atmosphere. In such a case, the passivation layer 140 may be formed by a thermal oxidation process that is performed due to heat generated while the focused ion beams 412 are irradiated.

In some embodiments, after the passivation layer 140 is formed, the inspection process may be performed using the at least one fiducial mark 430 as a reference point to extract the information on the positions of the defects existing on and/or in the multi-layered reflection layer 120.

The passivation layer 140 may be formed to extend from the pattern region PA to the black border region BA, and the passivation layer 140 in the black border region BA may extend from a top surface of the capping layer 130 into the at least one groove 430H to cover an inner surface of the at least one groove 430H.

Figure 5E:
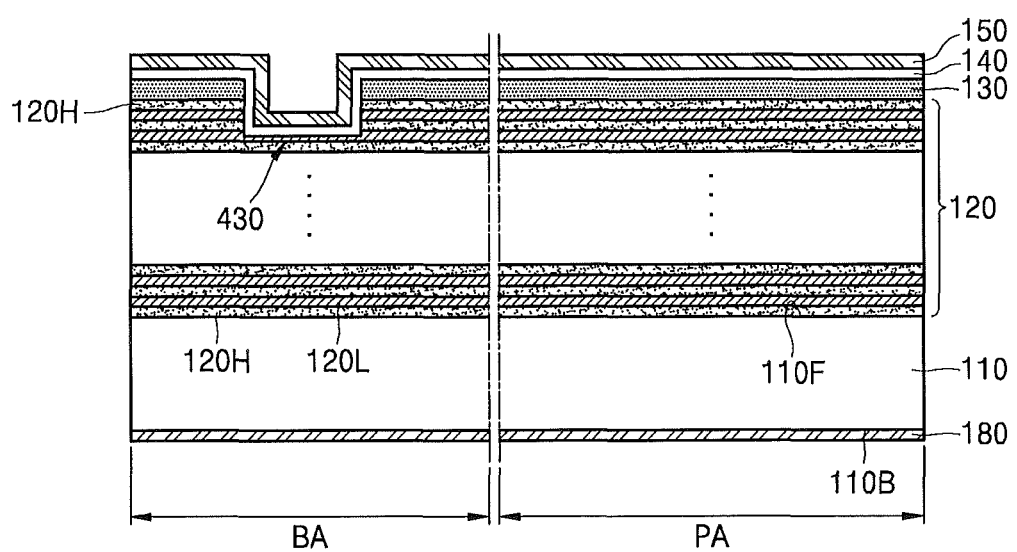

Referring to FIG. 5E, a buffer layer 150 may be formed on the passivation layer 140 in the black border region BA and the pattern region PA.

Subsequently, a light absorption layer (170 of FIG. 4B), a low reflectivity material layer (172 of FIG. 4B) and a mask layer (190 of FIG. 4B) may be sequentially formed on the buffer layer 150 to complete the reflective photomask blank 400 shown in FIGS. 4A and 4B.

In some embodiments, in order for the at least one fiducial mark 430 of the reflective photomask blank 400 to be correctly recognized for accurate alignment, a peripheral region of the at least one fiducial mark 430 may be etched using an exposure process and an etching process to clearly show off the at least one fiducial mark 430 before the light absorption layer 170 is patterned to form a reflective photomask.

FIGS. 6A to 6F are cross-sectional views illustrating a method of fabricating a reflective photomask according to some embodiments of the inventive concept. The embodiments illustrated in FIGS. 6A to 6F will be described in conjunction with a method of fabricating a reflective photomask 600 (see FIGS. 6E and 6F) using the reflective photomask blank 100 illustrated in FIG. 1. In FIGS. 6A to 6F, the same reference designators as used in FIG. 1 denote the same elements. Thus, detailed descriptions of the same elements as described with reference to FIG. 1 will be omitted to avoid duplicate explanation. Further, the following embodiments will be described in conjunction with an example in which the mask layer 190 of the reflective photomask blank 100 is formed of a hard mask layer.

Figure 6A:
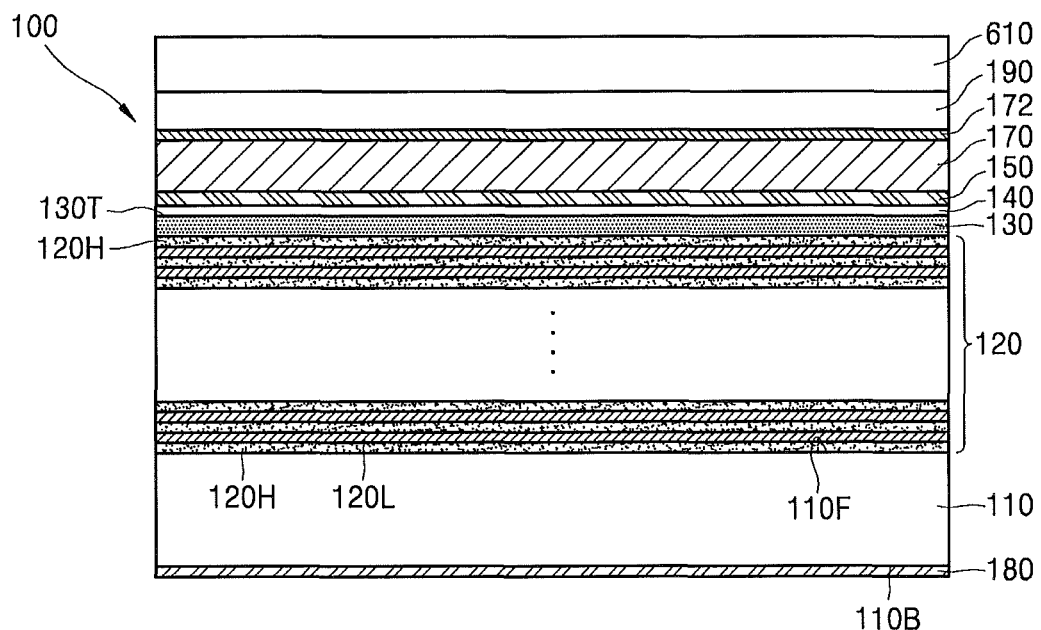
FIGS. 6A to 6F are cross-sectional views illustrating a method of fabricating a reflective photomask according to some embodiments of the inventive concept.

Referring to FIG. 6A, a resist layer 610 for an electron beam lithography process may be formed on the mask layer 190 using a spin coating process.

In some embodiments, the resist layer 610 may be formed of a chemically amplified resist layer. In some embodiments, the resist layer 610 may be formed to have a thickness of about 50 nanometers to about 100 nanometers.

Figure 6B:
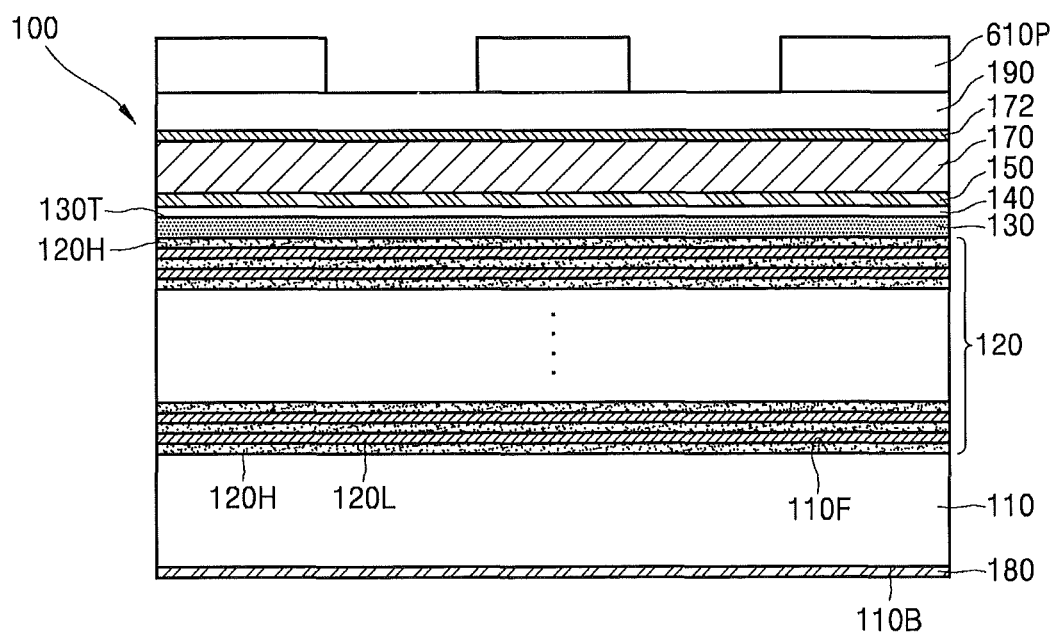

Referring to FIG. 6B, the resist layer 610 may be exposed and developed to form a resist pattern 610P defining pattern shapes which are transferred onto a wafer.

Figure 6C:
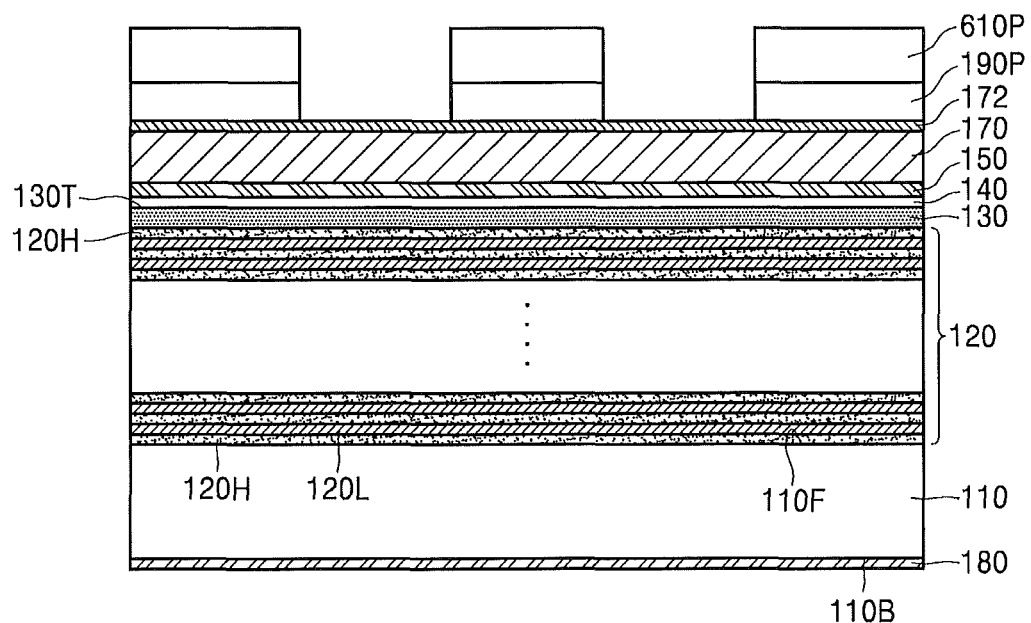

Referring to FIG. 6C, the mask layer 190 may be etched using the resist pattern 610P as an etch mask to form a mask pattern 190P.

Figure 6D:
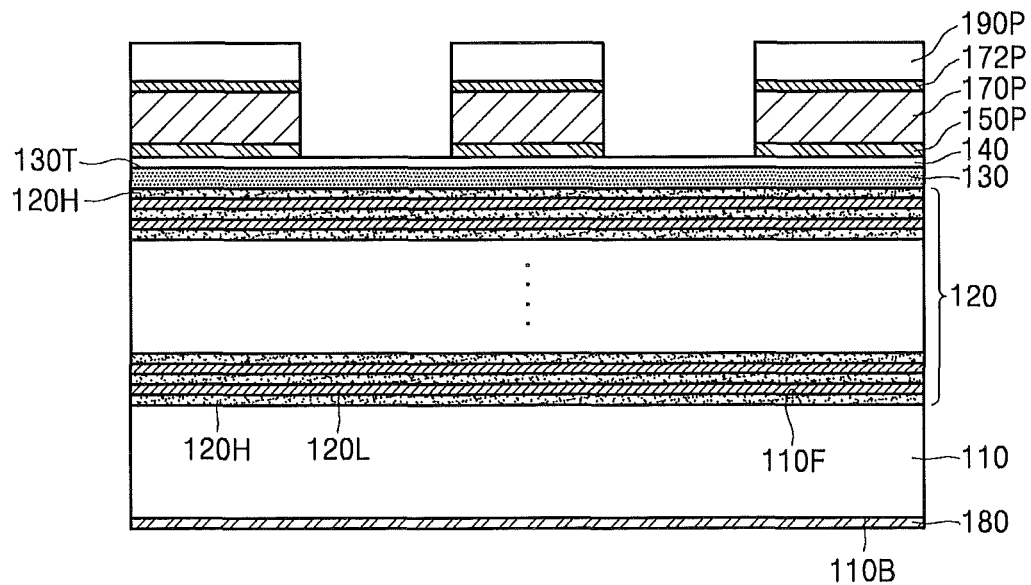

Referring to FIG. 6D, after removal of the resist pattern 610P, the low reflectivity material layer 172, the light absorption layer 170 and the buffer layer 150 may be sequentially etched using the mask pattern 190P as an etch mask to form a low reflectivity material pattern 172P, a light absorption pattern 170P and a buffer pattern 150P.

A chlorine-based gas or a mixture gas of a chlorine-based gas and an oxygen gas may be used as an etch gas when the low reflectivity material layer 172, the light absorption layer 170 and the buffer layer 150 are etched.

Even after the light absorption pattern 170P and the buffer pattern 150P are formed, the multi-layered reflection layer 120 may be still covered and protected by the capping layer 130. In addition, the capping layer 130 may still be covered by the passivation layer 140 even after the light absorption pattern 170P and the buffer pattern 150P are formed. Thus, even though the resultant where the light absorption pattern 170P and the buffer pattern 150P are formed is exposed to an oxygen-containing atmosphere, that is, an etching process and/or air, the passivation layer 140 may prevent oxygen atoms from being introduced into the capping layer 130 and/or into an interface between the multi-layered reflection layer 120 and the capping layer 130. As a result, no oxide layer may be formed between the multi-layered reflection layer 120 and the capping layer 130. Accordingly, a separation between the multi-layered reflection layer 120 and the capping layer 130 and a peeling of the capping layer 130 may be suppressed, thus improving the endurance of the reflective photomask against a cleaning process.

Figure 6E:
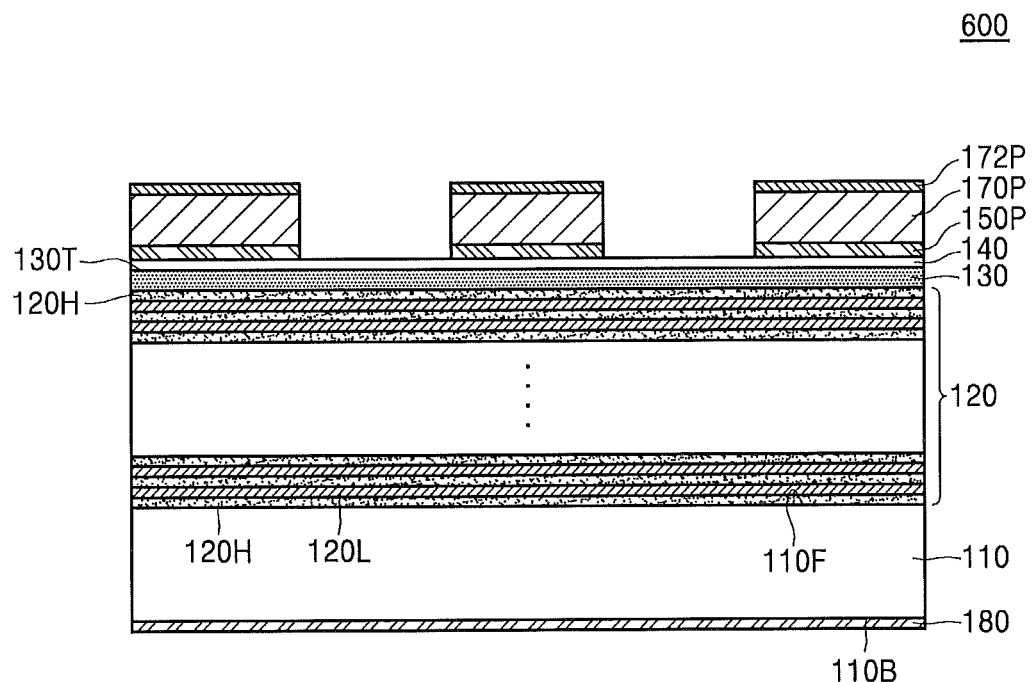

Referring to FIG. 6E, the mask pattern 190P may be removed to complete a reflective photomask 600.

In some embodiments, the mask pattern 190P may be removed using a dry etching process, but the inventive concept is not limited thereto.

Figure 6F:
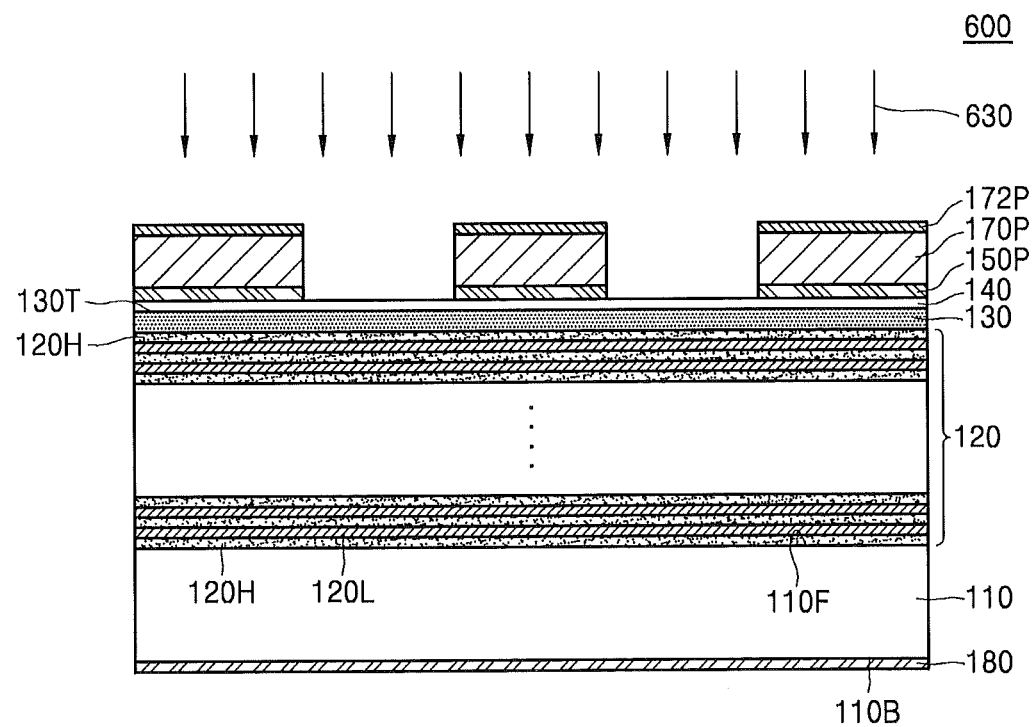

Referring to FIG. 6F, the reflective photomask 600 may be exposed to a cleaning process 630 to remove organic residues and/or particles remaining on the resultant where the mask pattern 190P is removed.

The cleaning process 630 may be performed using an ultraviolet (UV) irradiation, a cleaning solution including de-ionized (DI) water, or a combination thereof.

In some embodiments, the UV irradiation may be carried out using a UV lamp. For example, the UV irradiation may be carried out by irradiating a UV ray having a wavelength of about 172 nanometers for about 1 minute to about 20 minutes using a UV lamp in a cleaning chamber. The organic residues and/or the particles on the reflective photomask 600 may be removed by supplying an oxygen gas and a nitrogen gas into the cleaning chamber to generate an ozone ($O_3$) gas and by oxidizing the residues and/or the particles using hydroxyl (OH) groups generated from the ozone gas. The organic residues may be removed by oxidizing the organic residues using a UV irradiation.

In the event that the reflective photomask 600 is cleaned using the cleaning solution including the DI water, the cleaning solution may be spouted toward the reflective photomask 600 to remove particles remaining on a surface of the reflective photomask 600 with a physical force. In such a case, DI water may be supplied onto the reflective photomask 600 and ultrasonic waves may be applied to the reflective photomask 600.

The reflective photomask 600 according to the embodiments may be formed such that the multi-layered reflection layer 120 is protected by the capping layer 130 and the capping layer 130 is covered with the passivation layer 140. Thus, even though the reflective photomask 600 is exposed to the cleaning process 630 performed with a UV irradiation, a cleaning solution or a combination thereof two or more times to periodically clean the reflective photomask 600, the passivation layer 140 may prevent oxygen atoms from being introduced into the capping layer 130 or may prevent the capping layer 130 from being lifted. Accordingly, the passivation layer 140 may prevent a reflectivity of the multi-layered reflection layer 120 from being degraded, and a life time of the reflective photomask 600 may be improved.

Figure 7:
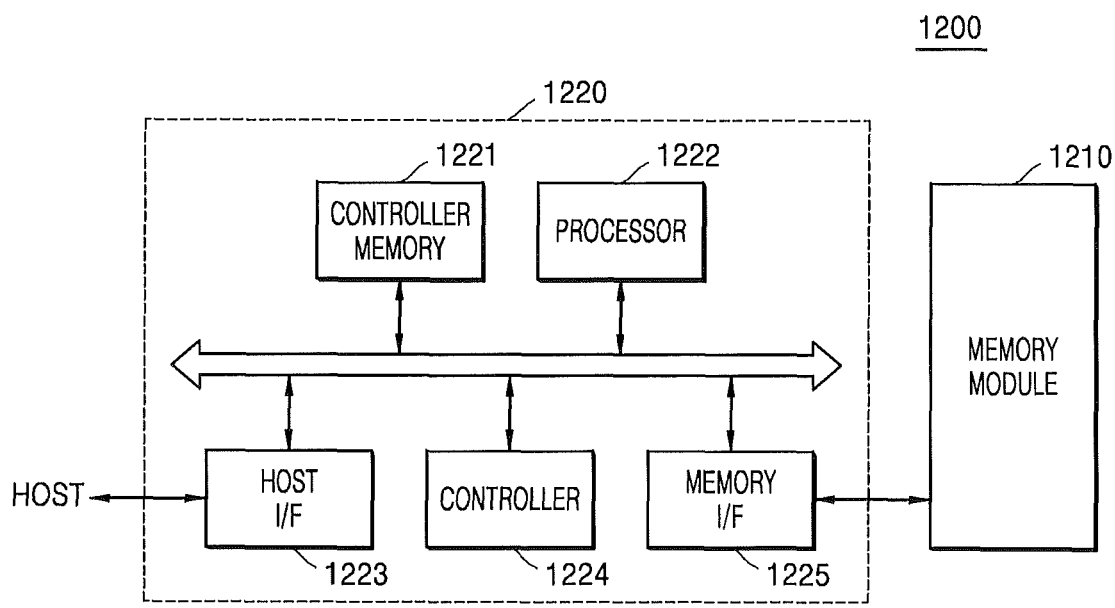
FIG. 7 is a block diagram illustrating a memory card including an integrated circuit manufactured using a reflective photomask blank or a reflective photomask according to some embodiments of the inventive concept.

FIG. 7 is a block diagram illustrating a memory card 1200 including an integrated circuit manufactured using at least one reflective photomask blank or at least one reflective photomask according to some embodiments of the inventive concept.

Referring to FIG. 7, the memory card 1200 may be configured to include a memory controller 1220 generating a command signal and an address signal and a memory module 1210 having at least one memory device such as a flash memory device. The memory controller 1220 may include a host interface 1223 configured to transmit the command signal and/or the address signal generated from the memory controller 1220 to a host or to receive the command signal and/or the address signal from the host, and a memory interface 1225 configured to transmit the command signal and/or the address signal to the memory module 1210 or to receive data stored in the memory module 1210 in response to the command signal and the address signal. The memory controller 1220 may further include a controller 1224, a controller memory 1221 such as an SRAM device and a processor 1222 such as a central processing unit (CPU) that communicate with the host interface 1223 and the memory interface 1225 through a common bus.

The memory module 1210 may receive the command signal and the address signal from the memory controller 1220 and may store data in at least one memory device thereof in response to the command signal and the address signal. Each of the memory devices constituting the memory module 1210 may include a plurality of memory cells having their own addresses and a decoder receiving the command signal and the address signal to generate a row signal and a column signal for accessing at least one memory cell in a program mode and/or in a read mode.

At least one of components constituting the memory card 1200, for example, at least one of the controller memory 1221, the processor 1222, the host interface 1223, the controller 1224 and the memory interface 1225 constituting the memory controller 1220 or at least one of the memory devices constituting the memory module 1210 may include an integrated circuit fabricated using at least one of reflective photomasks obtained from the reflective photomask blanks 100 and 400 illustrated in FIGS. 1, 4A and 4B or using the reflective photomask 600 illustrated in FIG. 6E.

Figure 8:
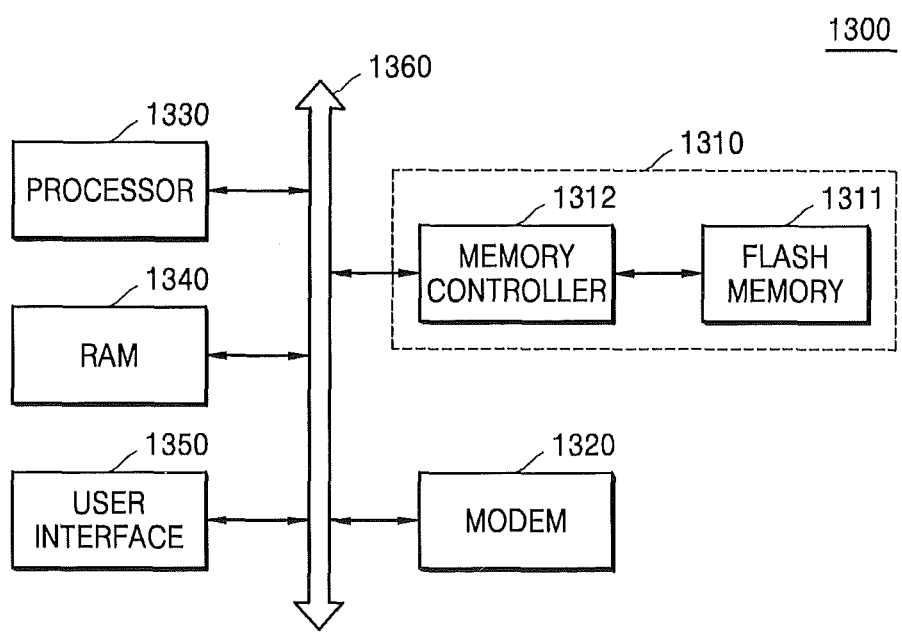
FIG. 8 is a block diagram illustrating a memory system employing a memory card including an integrated circuit manufactured using a reflective photomask blank or a reflective photomask according to some embodiments of the inventive concept.

FIG. 8 is a block diagram illustrating a memory system 1300 employing a memory card including an integrated circuit manufactured using at least one reflective photomask blank or at least one reflective photomask according to some embodiments of the inventive concept.

Referring to FIG. 8, the memory system 1300 may include a processor 1330, a random access memory (RAM) device 1340, a user interface 1350, a modem 1320 and a memory card 1310 that communicate with each other through a common bus 1360. In particular, the processor 1330, the RAM device 1340, the user interface 1350 and the modem 1320 may transmit signals to the memory card 1310 through the common bus 1360 and may receive signals from the memory card 1310 through the common bus 1360. At least one of the processor 1330, the RAM device 1340, the user interface 1350, the modem 1320 and the memory card 1310 constituting the memory system 1300 may include an integrated circuit fabricated using at least one of reflective photomasks obtained from the reflective photomask blanks 100 and 400 illustrated in FIGS. 1, 4A and 4B or using the reflective photomask 600 illustrated in FIG. 6E.

The memory system 1300 may be applicable to various electronic systems, for example, solid state disks (SSDs), CMOS image sensors (CISs), computer systems or the like.

The memory system 1300, the memory card 1200 and each component thereof may be encapsulated using any one of a ball grid array (BGA) technique, a chip scale package (CSP) technique, a plastic leaded chip carrier (PLCC) technique, a plastic dual in-line package (PDIP) technique, a multi chip package (MCP) technique, a wafer-level fabricated package (WFP) technique, a wafer-level processed stack package (WSP) technique and the like. However, the inventive concept is not limited thereto.

While the inventive concept has been particularly shown and described with reference to exemplary embodiments thereof, it will be understood that various changes in form and details may be made therein without departing from the spirit and scope of the following claims.

What is claimed is:

1. A reflective photomask blank comprising:
   a multi-layered reflection layer on a photomask substrate;
   a capping layer directly disposed on a top surface of the multi-layered reflection layer, the capping layer comprising at least one transition metal and silicon;
   a passivation layer disposed on a surface of the capping layer that is opposite the multi-layered reflection layer, wherein the passivation layer is configured to prevent oxygen atoms from being introduced into an interface between the multi-layered reflection layer and the capping layer; and
   a light absorption layer on the passivation layer.

2. The reflective photomask blank of claim 1, wherein the transition metal of the capping layer comprises at least one selected from ruthenium (Ru), nickel (Ni) and iridium (Ir).

3. The reflective photomask blank of claim 1, wherein the passivation layer comprises a silicon oxide layer.

4. The reflective photomask blank of claim 1, wherein a transition metal content of the capping layer is greater than a silicon content of the capping layer.

5. The reflective photomask blank of claim 1, wherein the capping layer further comprises at least one additive element selected from niobium (Nb), carbon (C), boron (B), aluminum (Al), yttrium (Y), germanium (Ge) and vanadium (V).

6. The reflective photomask blank of claim 1, wherein the capping layer further comprises nitrogen.

7. The reflective photomask blank of claim 1, wherein the capping layer comprises a compound material containing ruthenium (Ru) and silicon (Si).

8. The reflective photomask blank of claim 1, wherein the capping layer comprises a multi-layered structure comprising a ruthenium (Ru) film and a silicon (Si) film alternately stacked at least once.

9. The reflective photomask blank of claim 8, wherein a thickness of the ruthenium (Ru) film is greater than a thickness of the silicon (Si) film.

10. The reflective photomask blank of claim 1, wherein a thickness of the passivation layer is less than a thickness of the capping layer.

11. The reflective photomask blank of claim 1, further comprising a fiducial mark that is defined by a groove that penetrates the capping layer.

12. The reflective photomask blank of claim 11, wherein the passivation layer extends from a top surface of the capping layer to cover an inner surface of the groove that defines the fiducial mark.

13. The reflective photomask blank of claim 1, wherein the capping layer comprises an amorphous layer.

14. The reflective photomask blank of claim 1,
   wherein a topmost layer of the multi-layered reflection layer is a silicon layer; and
   wherein a thickness of the capping layer is greater than a thickness of the topmost layer of the multi-layered reflection layer.

15. A reflective photomask comprising a patterned light absorption layer that is obtained by patterning the light absorption layer of the reflective photomask blank according to claim 1.

16. A reflective photomask blank comprising:
a reflection layer on a photomask substrate;
a capping layer on a top surface of the reflection layer and contacting the top surface of the reflection layer, the capping layer comprising a transition metal and silicon; and
a passivation layer on a surface of the capping layer that is opposite the reflection layer and that contacts the capping layer,
wherein the passivation layer is configured to prevent oxygen atoms from being introduced into an interface between the reflection layer and the capping layer.

17. The reflective photomask blank according to claim 16, wherein the capping layer comprises a transition metal content and a silicon content that is less than the transition metal content.

18. The reflective photomask blank according to claim 16,
wherein the transition metal comprises at least one of ruthenium (Ru), nickel (Ni) and iridium (Ir),
wherein the passivation layer comprises silicon oxide, and
wherein the capping layer further comprises at least one of niobium (Nb), carbon (C), boron (B), aluminum (Al), yttrium (Y), germanium (Ge) and vanadium (V).

19. The reflective photomask blank according to claim 16, further comprising a light absorption layer on the passivation layer.

20. The reflective photomask blank according to claim 16, wherein the capping layer further comprises:
nitrogen; and
a multi-layered structure comprising a ruthenium (Ru) film and a silicon (Si) film that are alternately stacked at least once,
wherein a thickness of the ruthenium (Ru) film is greater than a thickness of the silicon (Si) film.

* * * * *